(12) United States Patent
Keller, Jr. et al.

(10) Patent No.: US 8,010,764 B2
(45) Date of Patent: Aug. 30, 2011

(54) METHOD AND SYSTEM FOR DECREASING POWER CONSUMPTION IN MEMORY ARRAYS HAVING USAGE-DRIVEN POWER MANAGEMENT

(75) Inventors: Thomas Walter Keller, Jr., Austin, TX (US); Charles R. Lefurgy, Round Rock, TX (US); Hai Huang, Marion, OH (US)

(73) Assignee: International Business Machines Corporation, Armonk, NY (US)

( * ) Notice: Subject to any disclaimer, the term of this patent is extended or adjusted under 35 U.S.C. 154(b) by 1266 days.

(21) Appl. No.: 11/176,819

(22) Filed: Jul. 7, 2005

(65) Prior Publication Data

US 2007/0011421 A1    Jan. 11, 2007

(51) Int. Cl.
*G05F 12/00* (2006.01)
(52) U.S. Cl. . 711/165; 711/157; 711/158; 711/E12.002; 711/E12.01
(58) Field of Classification Search ............ 711/165, 711/157; 714/7
See application file for complete search history.

(56) References Cited

U.S. PATENT DOCUMENTS

| | | | | |
|---|---|---|---|---|
| 4,669,056 A | * | 5/1987 | Waldecker et al. | 710/114 |
| 5,596,740 A | * | 1/1997 | Quattromani et al. | 711/157 |
| 5,687,382 A | * | 11/1997 | Kojima et al. | 713/320 |
| 5,761,695 A | * | 6/1998 | Maeda et al. | 711/5 |
| 5,805,873 A | * | 9/1998 | Roy | 713/502 |
| 5,928,365 A | | 7/1999 | Yoshida | |
| 6,097,662 A | * | 8/2000 | Itou | 365/230.03 |
| 6,453,403 B1 | * | 9/2002 | Czajkowski | 711/170 |
| 6,636,951 B1 | * | 10/2003 | Tachikawa | 711/154 |
| 2001/0013087 A1 | * | 8/2001 | Ronstrom | 711/133 |
| 2002/0013087 A1 | * | 1/2002 | Doriski, Jr. | 439/502 |
| 2002/0103975 A1 | * | 8/2002 | Dawkins et al. | 711/133 |
| 2002/0152181 A1 | * | 10/2002 | Kanai et al. | 705/80 |
| 2002/0199129 A1 | | 12/2002 | Bohrer et al. | |
| 2003/0079151 A1 | | 4/2003 | Bohrer et al. | |
| 2004/0123042 A1 | | 6/2004 | Shafi et al. | |
| 2005/0125702 A1 | | 6/2005 | Huang et al. | |
| 2005/0125703 A1 | | 6/2005 | Lefurgy et al. | |

OTHER PUBLICATIONS

U.S. Appl. No. 10/738,719, Rawson, et al.
Balasubramonian et al. "Hot and Cold: Using Criticality in the Design of Energy-Efficient Cashes", 3rd Workshop on PACS, Dec. 2003.

(Continued)

*Primary Examiner* — Reginald G Bragdon
*Assistant Examiner* — Victor W Wang
(74) *Attorney, Agent, or Firm* — Mitch Harris, Atty at Law, LLC; Andrew M. Harris; Libby Z. Toub (57) ABSTRACT

A method and system for decreasing power consumption in memory arrays having usage-driven power management provides decreased power consumption in the memory array of a processing system. Per-page usage information is gathered on memory by a memory controller and periodically evaluated by software. The software distinguishes between more frequently accessed pages and less frequently accessed pages by analyzing the gathered usage information and periodically migrates physical memory pages in order to group less frequently accessed pages and more frequently access pages in separately power-managed memory ranks. When used in conjunction with a usage-driven power management mechanism, the ranks containing the less frequently accessed pages can enter deeper power-saving states and/or any power-saving state for longer periods. Operation may be further enhanced by using packed allocation in the memory ranks containing the less-frequently accessed pages and scattered allocation in the memory ranks having more frequently accessed pages.

14 Claims, 6 Drawing Sheets

OTHER PUBLICATIONS

Rajamani, K. et al. "Evaluating Request-Distriubtion Schemes for Saving Energy in Server Clusters", IEEE Intern Symp on Perf Anly of System Issue ISPASS '03, 2003.

Huang, H. et al. "Design and Implementaion of Power-Aware Virtual Memory" Usenix Annual Tech Conf, 57-70, 2003.

Qingbo Zhu et al. "Reducing Energy Consumption of Dish Storage Using Power-Aware Cache Management" Tenth Inter Symp on High Perf Computer, 2004.

Delaluz, V. et al. "DRAM Energy Management Using Software and Hardware Directed Power Mode Control" Inter Symp on High Perf Comp Architecture. 159-2001. 2001.

Copeland, G. et al. "Data Placement in Bubba" Proceedings of SIGMOD Issue ISPASS '03, 1988, ACM.

Chilimbi, T.M. et al. "Cache-Conscious Strucuture Layout" PLDI '99, May 1999, ACM.

Fan, X et al. "Modeling of DRAM Power Control Policies Using Deterministric and Stochastic Petri Nets" Workshop on Power-Aware Computer Systems, 2002.

Lebeck, A.R. et al. "Power Aware Page Allocation" Asplos Proceedings. 105-116, 2000.

Cohn and P.G. Lowney "Hot Cold Optimization of Large Window/NT Applications" Micro29, 80-89, Dec. 1996, IEEE/ACM.

Delaluz, V. et al. "Scheduler-Based DRAM Energy Management" Design Automation Conf 39, 697-702, 2002.

Fan, X et al. "Memory Controller Policies for DRAM Power Management" Inter Symp on Low Power Elect and Design, 129-134, 2001.

\* cited by examiner

METHOD AND SYSTEM FOR DECREASING POWER CONSUMPTION IN MEMORY ARRAYS HAVING USAGE-DRIVEN POWER MANAGEMENT

This invention was made with Government support under PERCS II, Darpa Contract NBCH3039004. THE GOVERNMENT HAS CERTAIN RIGHTS IN THIS INVENTION.

CROSS-REFERENCE TO RELATED APPLICATIONS

The present application is related to previously-filed co-pending U.S. patent application Ser. No. 10/727,319, entitled "METHOD AND SYSTEM FOR POWER MANAGEMENT INCLUDING DEVICE CONTROLLER-BASED DEVICE USE EVALUATION AND POWER-STATE CONTROL", filed on Dec. 3, 2003; Ser. No. 10/727,320 entitled "METHOD AND SYSTEM FOR POWER MANAGEMENT INCLUDING LOCAL BOUNDING OF DEVICE GROUP POWER CONSUMPTION", filed on Dec. 3, 2003; and Ser. No. 10/738,719, entitled "METHOD AND SYSTEM FOR MACHINE MEMORY POWER AND AVAILABILITY MANAGEMENT IN A PROCESSING SYSTEM SUPPORTING MULTIPLE VIRTUAL MACHINES", filed on Dec. 17, 2003. Each of the above-referenced U.S. Patent applications has at least one inventor in common with the present application and is assigned to the said Assignee. The specifications of all of the above-referenced applications are incorporated herein by reference.

BACKGROUND OF THE INVENTION

1. Technical Field

The present invention relates generally to memory management in processing systems, and more particularly, to a memory management scheme that provides reduction in memory array power consumption within a processing system when used in conjunction with a memory device power management scheme.

2. Description of the Related Art

Present-day computing systems include sophisticated power-management schemes for a variety of reasons. For portable computers such as "notebook", "laptop" and other portable units including personal digital assistants (PDAs), the primary power source is battery power. Intelligent power management extends battery life, and therefore the amount of time that a user can operate the system without connecting to a secondary source of power. Power management has also been implemented over "green systems" concerns so that power dissipated within a building is reduced for reasons of energy conservation and heat reduction.

Recently, power management has become a requirement in line power connected systems, particularly high processing power cores and systems because the components and/or systems are now designed with total potential power consumption levels that either exceed power dissipation limits of individual integrated circuits or cabinets, or the total available power supply is not designed to be adequate for operation of all units simultaneously. For example, a processor may be designed with multiple execution units that cannot all operate simultaneously due to either an excessive power dissipation level or a problem in distributing the requisite current level throughout the processor without excessive voltage drop.

The above-incorporated U.S. Patent Applications "METHOD AND SYSTEM FOR POWER MANAGEMENT INCLUDING DEVICE CONTROLLER-BASED DEVICE USE EVALUATION AND POWER-STATE CONTROL" and "METHOD AND SYSTEM FOR POWER MANAGEMENT INCLUDING LOCAL BOUNDING OF DEVICE GROUP POWER CONSUMPTION" provide implementations of power management schemes for memory and other devices that can reduce the power consumed by a processing system, either by direction, or when devices in the system are infrequently used.

However, in many processing system applications, the amount of power saved will be minimal, as all of the memory devices may be active or be continuously entering and leaving a power-saving state other than the lowest power state available for most of the time the processing system is operating. The lowest power state may not even be reached by any of the memory devices during periods of high system activity if entry to the power saving states is controlled by a timer, as in the power-management control technique above-incorporated U.S. Patent Application "METHOD AND SYSTEM FOR POWER MANAGEMENT INCLUDING DEVICE CONTROLLER-BASED DEVICE USE EVALUATION AND POWER-STATE CONTROL".

It is therefore desirable to provide a method and system for decreasing power consumption in a memory array of a processing system, wherein lower power consumption states form a greater portion of the overall power management state of the memory array over total system operating time.

SUMMARY OF THE INVENTION

The objective of providing decreased power consumption within a memory array of a processing system is provided by a memory management scheme that reorganizes data values and instructions stored in memory so that less frequently accessed data values and instructions are segregated from those more frequently accessed by placing each in a separately power-manageable portion of the memory array. When used in combination with a power-management technique that uses memory device activity measurement to determine when to place the memory devices in power-saving states, the result is lower power consumption by the overall memory array.

The memory controller maintains an access count for each page that is accessible by the operating system. The operating system periodically evaluates the access counts for pages within a first and second portion of the memory array and migrates pages having a higher access frequency from the second ("cold") portion to the first ("hot") portion and pages having a lower access frequency from the first portion to the second portion, resulting in division of the memory array into two or more separately power-managed sets of memory devices, with differing levels of access frequency. The result is that the second portion of the memory will be in a "deeper" power-management state for more time than would be possible when the memory was not partitioned. The technique can be extended to multiple memory portions, each having a progressively lower level of activity after page migration has optimized the location of memory pages in conformity with the relative access frequencies of the pages. The process operates continuously, so that as memory is allocated and released for an application or the operating system, pages are migrated to preserve lower power operation for the "colder" portions of the memory array.

Increased performance when multiple device sets are available in the "hot" and "cold" portions of the memory array can be provided by a memory address interleaving scheme that differs between the hot and cold portions of the memory array. The interleaving scheme can spread granules of memory (generally a segment of memory equal to the size of a cache line of the lowest-level cache) across device sets in the hot portion of the memory array, but consolidate granules in the cold portion of the memory array (by not interleaving). The spread-interleaving in the hot section provides reduced access times/reduced collisions, while the granule consolidation in the cold portion provides for increased power savings in the device sets that contain fewer pages or are empty.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a memory controller and method for reducing power consumption in memory arrays where individual sets of devices or "ranks" within the memory array can be power-managed separately. The memory controller and method of the present invention provide a mechanism for determining the frequency of access to individual pages within the memory array, and a mechanism for migrating pages between at least two portions of the memory array that include at least one rank each so that frequently accessed pages are located in a "hot" rank or ranks and less-frequently accessed pages are located in a "cold" rank or ranks. The result is that the cold rank or ranks can enter deeper power reduced states more frequently and for longer intervals, as the migration of memory pages results in less frequent access to the "cold" portion of the memory array.

The above-incorporated U.S. Patent Application "METHOD AND SYSTEM FOR POWER MANAGEMENT INCLUDING DEVICE CONTROLLER-BASED DEVICE USE EVALUATION AND POWER-STATE CONTROL", provides a mechanism for local control and evaluation of power management settings by a memory controller within a processing system and the features disclosed therein are used in combination with the memory migration scheme of the present invention to yield specific power-management embodiments of the present invention. However, any scheme in which power management states of memory devices are controlled in conformity with a measure of access frequency to the individual device ranks should gain benefit from the application of the page access frequency and page migration scheme of the present invention, and combinations of alternative power management techniques with the methods and memory controller disclosed herein are contemplated by the present invention.

Figure 1:
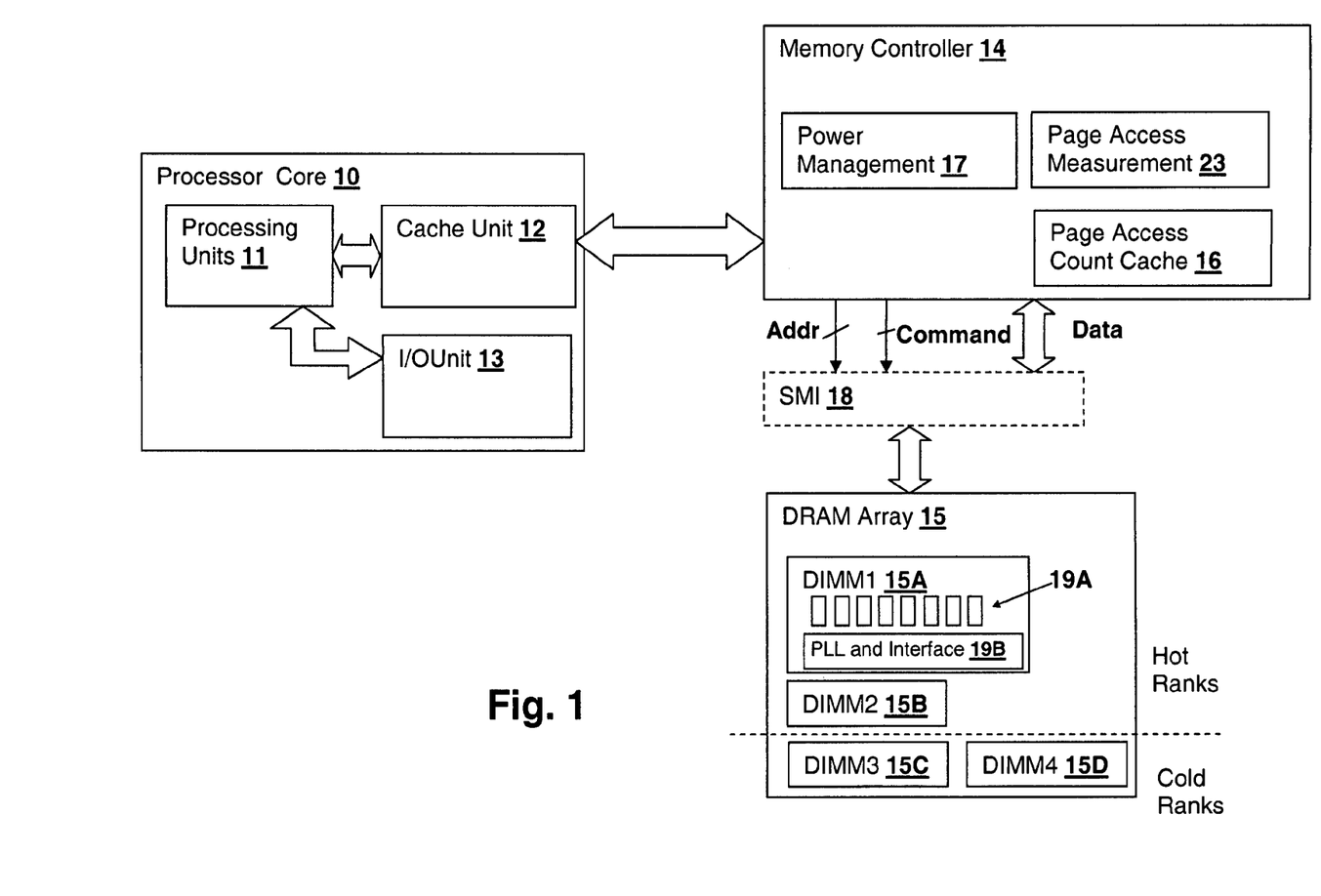
FIG. 1 is a block diagram of a computing system in accordance with an embodiment of the invention.

With reference now to the figures, and in particular with reference to FIG. 1, there is depicted a block diagram of a computer system including a memory controller 14 embodying a method and an apparatus in accordance with the present invention. Memory controller 14 is coupled to a dynamic random-access memory (DRAM) array 15 and provides control signals in the form of address lines and command strobes. Memory controller 14 is also coupled to a processor core 10 for storing and loading program instructions and data. Memory controller 14 includes a power management unit 17 that stores power management settings for each memory module (rank) within DRAM array 15 as described in the above-referenced U.S. Patent Application. Processor core 10 includes multiple processing units 11 coupled to an I/O unit 13 that provides for communication with device controllers such as memory controllers 14. Processor core 10 also includes one or more cache units 12 that generally provide the memory interface to memory controller 14.

In larger systems, multiple DRAM arrays 15 may be coupled to memory controller 14 by one or more Synchronous Memory Interfaces (SMIs) 18 which provide partitioning of the memory subsystem into large banks. If incorporated, SMIs 18 could also include some of the features of the present invention, such as page access counters, memory module usage counters/evaluators and control logic as described below. Therefore, any inclusion of portions of the structures and techniques of the present invention within SMIs 18, should be understood as contemplated by the present invention, as SMIs 18 are memory controllers within the context of the present invention.

DRAM array 15 includes multiple dual in-line memory modules (DIMMs) 15A-15D, each of which can be power-managed separately. Other power-management granularity is possible, such as powering down banks within DIMMs 15A-15D, if bank-level power management is possible. However, in general, power management at present is generally performed at the DIMM level. DIMMs 15A-15D each include memory devices 19A and interface circuits 19B that include a phase-lock loop (PLL) for synchronizing the memory device 19A with the DIMM bus interface to SMI 18 or memory controller 14. The power management states available for setting within DIMMs 15A-15D, vary based on design, but generally a low-power standby state, a power down mode, and a self-refresh state are available. In the self-refresh state, the external PLL within interface circuits 19B can be disabled. The PLL consumes a significant amount of the total power consumed by DIMMs 15A-15D, so the self-refresh state is a very desirable power management state, but the recovery time for the self-refresh state is very high, as the PLL must be reactivated and re-synchronize memory devices 19A with the external bus.

The above-referenced U.S. Patent Application noted that in order to effectively use the per-process selective DIMM power management, known techniques within the operating system memory manager were employed to effectively group allocated memory resources so that the resources are aggregated within the minimum number of memory modules. However, the present invention further refines the power management capabilities of the processing system by controlling the position of memory pages amongst DIMMs 15A-15D, which for illustrative purposes are shown as a pair of hot ranks (DIMMs in the exemplary case) 15A-15B and cold ranks 15C-15D. Where the technique disclosed in the above-referenced U.S. Patent Application describes a memory allocation scheme that aggregates pages within a minimum number of DIMMs, the present invention segregates more frequently accessed pages from less-frequently accessed pages in order to permit the power management mechanism to more effectively save power in the "cold" ranks of memory (e.g., DIMMs 15C-D), while permitting "hot" ranks (e.g., DIMMs 15A-B) to generally remain in a powered state either continuously or to remain in less "deep" power savings modes such as "standby" or "power down", while the cold ranks remain in self-refresh mode more of the time. (Power management is also applied to DIMMs 15A-B and for example, when all execution and data values for a period are available from cache unit 12, all of DRAM array 15 may enter a power-savings mode.)

Pages (and any possibly stored sub-page sized chunks) can be aggregated within the cold portion of the memory to yield a minimum number of ranks that will be active at all, while memory values are generally interleaved within the hot portion of memory to minimize access delay. Alternatively, the cold portion of memory may be sub-divided and groups of pages having similar access frequencies. For example, page access frequencies can be grouped into ranges and a storage rank within the cold memory portion selected for a given page in conformity with it's recent access frequency.

In order to support the above-mentioned hot/cold segregation and optional selective interleaving, both a hardware and a software mechanism are employed in addition to a hardware power-management scheme such as that described in the above-referenced U.S. Patent Application. The software mechanism is provided by an operating system housekeeping thread or threads. The hardware mechanism is provided within memory controller 14 and includes a page access measurement circuit 23 that increments a counter (generally a memory location within one of the hot ranks) for each page of physical memory. A page access count cache 16 is also included so that the mechanism does not worsen power consumption by adding substantially to the memory accesses generated by the system. More frequently accessed pages will have associated counters cached within page access count cache 16 on a most-recently-used (MRU) basis, and therefore only accesses to pages having un-cached counters will generate an additional memory access for incrementing the counter. Memory controller 14 includes the logic to increment values in page access count cache 16 in response to page accesses detected by page access measurement logic 23 and page access count cache 16 includes cache control logic to store and retrieve values from DRAM array 15.

Figure 2:
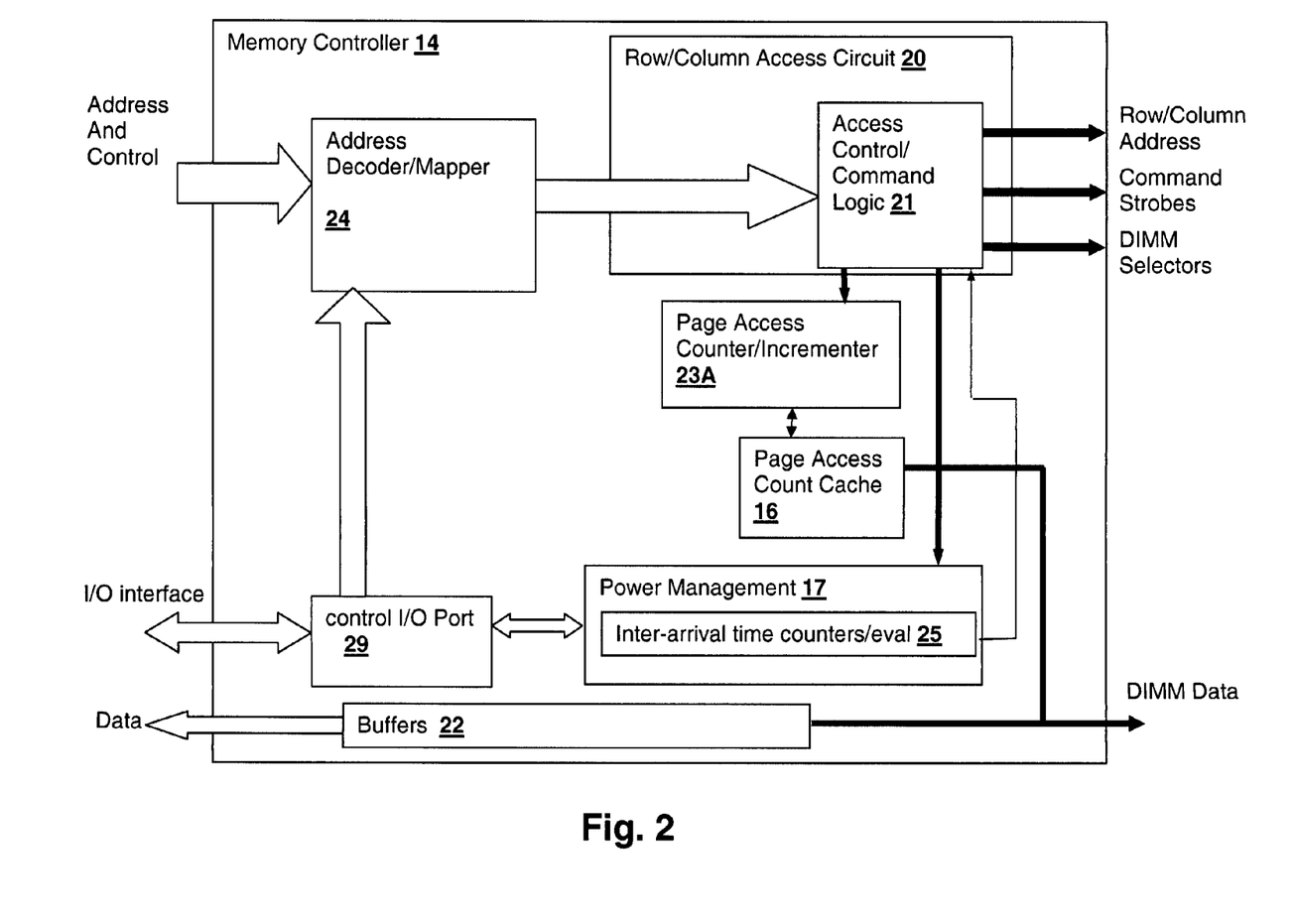
FIG. 2 is a block diagram depicting a memory controller in accordance with an embodiment of the present invention.

Referring now to FIG. 2, details of memory controller 14 are depicted in accordance with an embodiment of the present invention. Address and control signals are provided to an address decoder/mapper 24 from processor core 10 or may be generated internally in the case of refresh or cache control implementations. Address decoder/mapper 24 provides signals to a row/column access circuit 20 that provides command strobes, and DIMM selectors as well as column/row address signals to DIMMs 15A-D via access control/command logic 21 for performing memory accesses. Access control/command logic also forwards commands from power management unit 17 to DIMMs 15A-D for setting power management states of individual DIMMs 15A-D. In embodiments where access counters are provided within DIMMs 15A-D, commands are also forwarded to retrieve the access counts for use by power management unit 17. Memory controller 14 also includes data buffers 22 for buffering data transferred to and from DIMMs 15A-D, as well as a control I/O port 29 for receiving control information from processor core 10, as well as providing register read ports from which processor core 10 can retrieve the current status of memory controller 14. Additionally, control I/O port 29 provides access to registers within power management unit by processor core 10 as will be described in detail below. Power management unit 17 includes inter-arrival time counters and evaluators 25 as described in the above-referenced U.S. patent application (one set for each of DIMMs 15A-D in the depicted embodiment). When the inter-arrival time of DIMM access exceeds a predetermined threshold, the particular module (rank) is placed in a lower-power operating mode by the device controller via access control and command logic 21.

Page access counter/incrementer 23A and page access count cache 16 are coupled to row/column access circuit 20 so that a corresponding page can be identified (from the physical address) for each memory access, and a page access count incremented. A counter size that is sufficient for practicing the invention is a 32-bit counter, but the invention is not limited as to range of counts, as long as sufficient resolution is provided to determine relative access frequencies of pages sufficient to redistribute them for effective power management and so that the counters do not overflow before the operating system can read and reset them. An alternative is to use a smaller counter width, but provide a saturating counter so that the count does not roll over. As long as the operating system reads the saturating counter values frequently enough that meaningful access distribution information is provided, a smaller counter width can be used resulting in lower storage requirements for the count value cache and count values stored in memory. The page access counts are stored in memory as mentioned above, so that an operating system thread can occasionally scan the count values to determine when to migrate pages between the hot and cold portions of memory. While the present illustration shows a 2-part memory having a hot portion and a cold portion, it should be understood that memory 15 can be further subdivided into hotter vs. colder portions. For example, each one of DIMMs 15A-D could have pages assigned so that the average power management state is of longer duration and/or deeper (i.e., lower power consumption) for each progressively "colder" DIMM.

However, assignment of only one rank to the "hottest" values has a disadvantage of increasing the frequency of access collisions/contentions for the most frequently accessed memory values. Therefore, the present invention provides a selective interleave control scheme that may be used to further enhance operation of a processing system. In the selective interleave control scheme, memory within the hot portion (e.g., DIMMs 15A-B) is allocated on a rank-spread interleaving basis, which can be performed by spread allocating memory granules (i.e., the smallest memory chunk size) across multiple hot ranks. Memory within the cold portion (e.g., DIMMs 15C-D) is not interleaved. By interleaving the hot portion of the memory array, access time is reduced for frequently accessed pages (by spreading each page's memory locations across the hot ranks), while not interleaving the cold pages reduces the number of ranks accessed for a given page.

Figure 3:
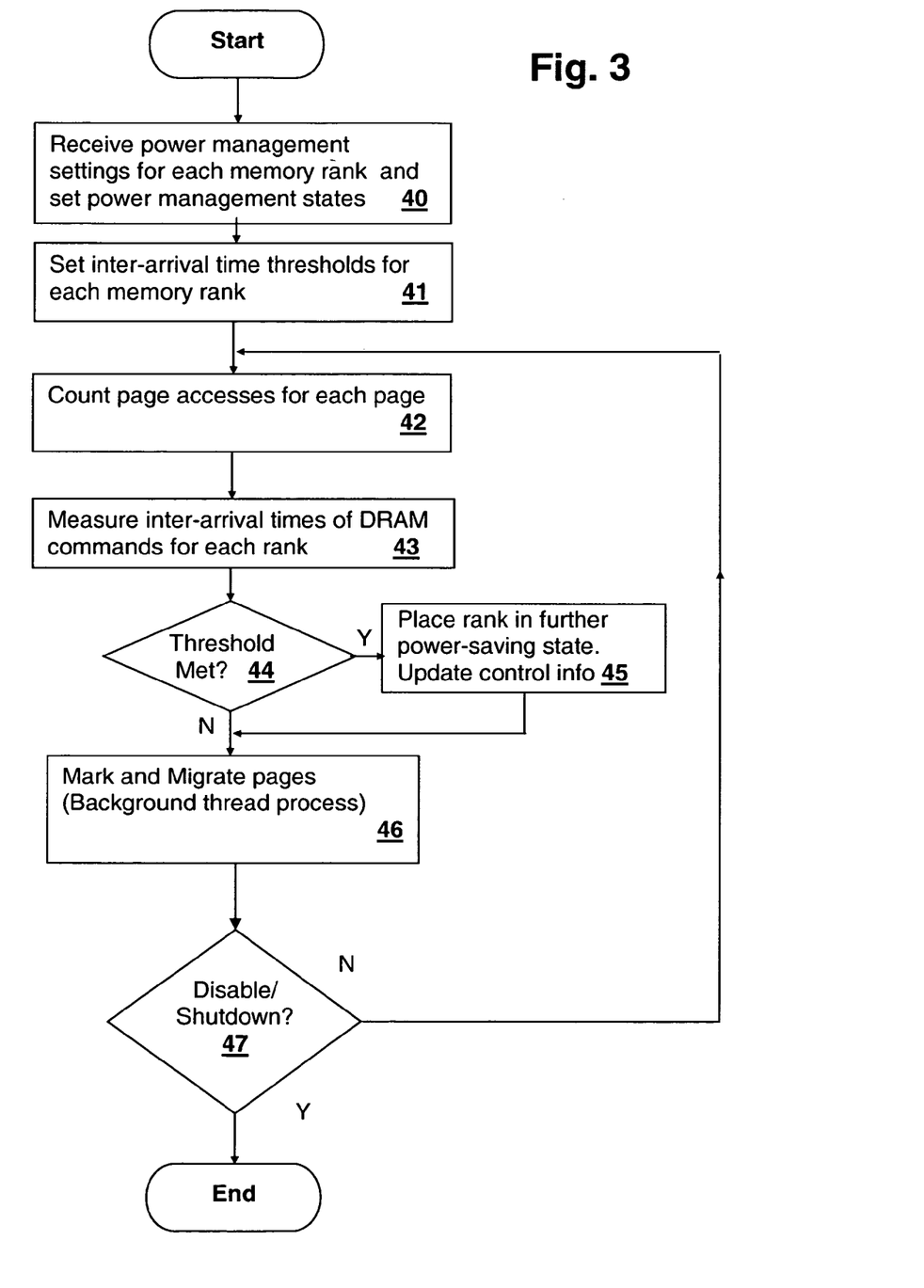
FIGS. 3-6 are flowcharts depicting methods in accordance with embodiments of the present invention.

Referring now to FIG. 3, a flowchart depicting a method in accordance with an embodiment of the invention is shown. First, memory controller 14 (or other unit incorporating the power management control mechanisms disclosed above) receives initial power management settings for each memory rank and sets the power management states of each memory rank (step 40). The system also sets the power-management (e.g., inter-arrival time) thresholds for each memory rank (step 41). At each memory access, the page count is updated for the particular page being accessed (step 42) and inter-arrival times are updated at the accessed memory rank (step 43). If a threshold value of inter-arrival time is met (decision 44), the memory rank is placed in a lower power-consuming state (step 45) by the memory controller. Periodically, an operating system background process (shown here for completeness) scans the page count values and migrates pages in conformity with the page access counts stored in Step 42 (step 46). Until the scheme is disabled or the system shut down (decision 47), the power management, page access counting and migration of step 42-step 46 are repeated.

Figure 4:
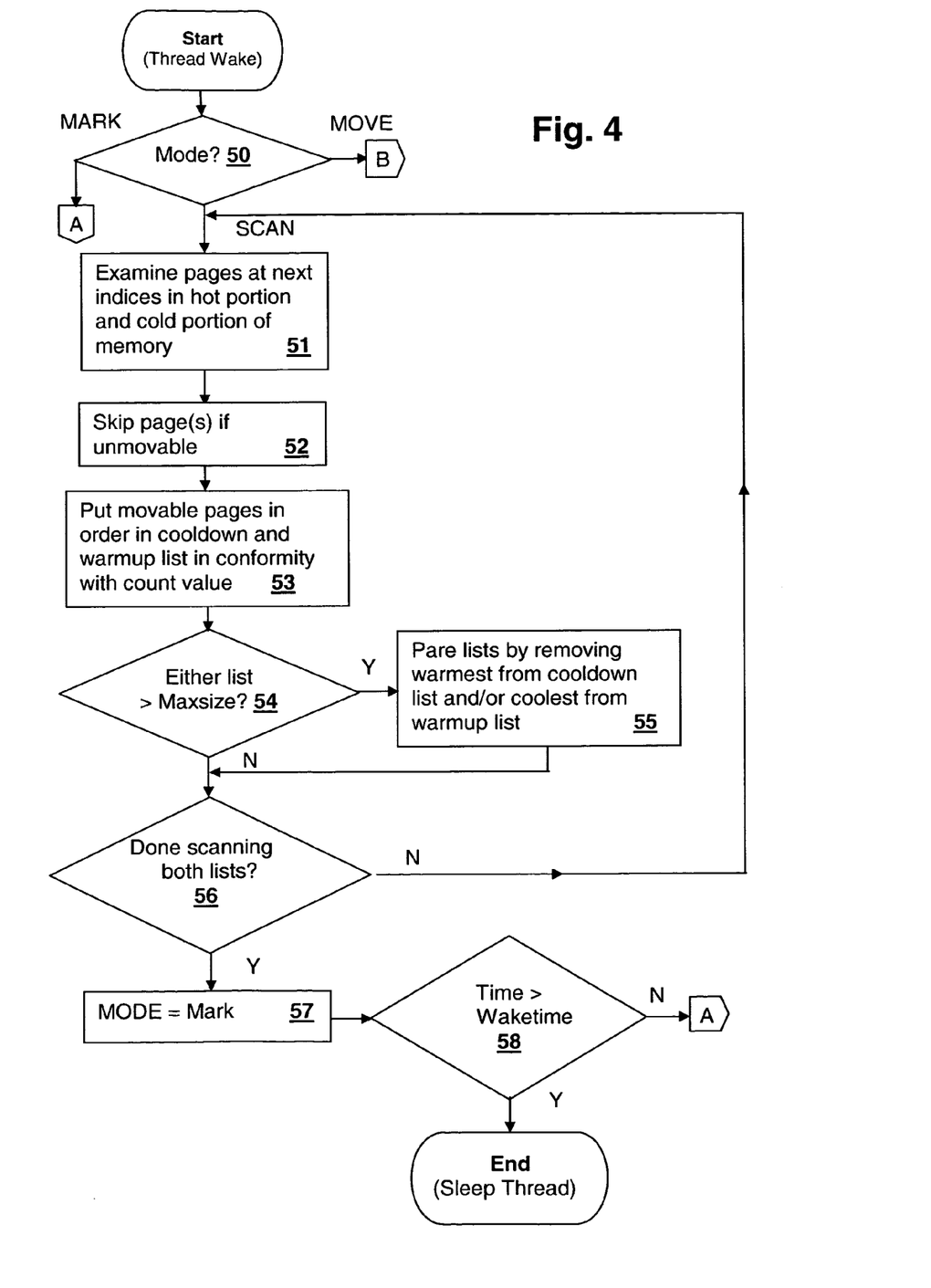

Referring now to FIG. 4, a process forming part of the page identification and migration step 46 above is depicted. At the start of the process (generally when the operating system thread is awakened by a timer or scheduler) the thread first checks to see what mode it has been left in: scan, mark or move (decision 50). The scan mode runs through the pages in hot and cold memory to select candidate pages to migrate, the mark mode makes decisions about which pages to migrate based on the results of the scan mode and the migrate mode performs the actual migration of pages. The modes are entered sequentially as described above and can be performed by a single operating system thread. In scan mode, the count values for pages in hot and cold memory are examined (step 51) and if the pages are unmovable, they are skipped (step 52). Otherwise, if each page is movable, it is placed in the corresponding list (cooldown list for the hot portion of memory and warmup list for the cold portion of memory) (step 53). The above action would tend to make the lists grow. However, the method determines whether either list has exceeded its maximum size (decision 54) and if so, the list is pared to remove the member with the highest count from the cooldown list or the member with the lowest count from the warmup list (step 55). If scanning is complete for both lists (decision 56) then the mode is set to MARK (step 57) and if the thread wake time has expired (decision 58), then the thread sleeps, otherwise processing continues in MARK mode. It should be understood that the above described list processing for hot and cold portions of memory can be performed sequentially or concurrently, whichever is more efficient based on the relative sizes of the memory portions. Further, the lists do not have to be equal in size.

Figure 5:
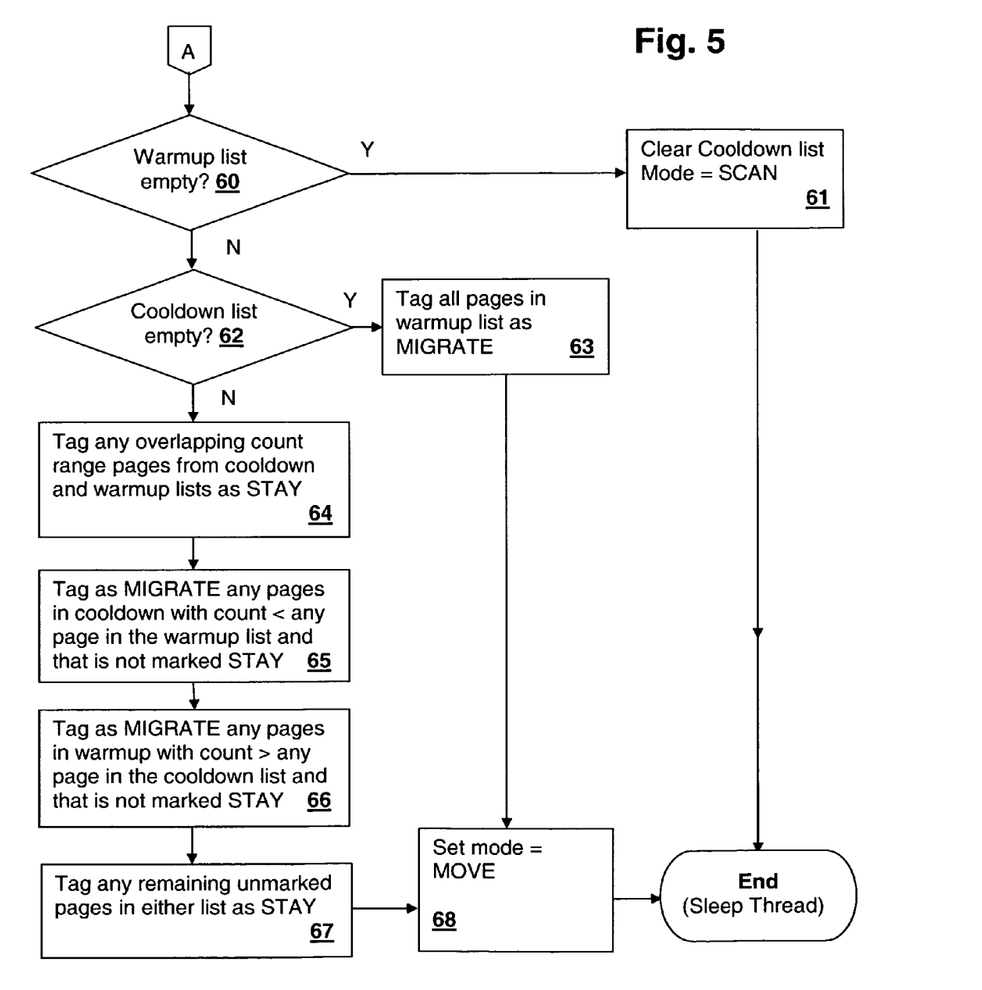

Referring now to FIG. 5 processing of the MARK portion of the method as continued from tag A on FIG. 4. If the warmup list is empty (decision 60), the cooldown list is cleared and the mode is set back to SCAN (step 61), as there is no reason to mode memory out of the hot portion memory. Similarly, if the cooldown list is empty in addition (step 62) then all pages in the warmup list are tagged as MIGRATE (step 68). Any pages having counts in the lists that in overlapping ranges are tagged as STAY (step 64), and then any pages in the cooldown list that have counts less than any page in the warmup list and that are not marked STAY are set to MIGRATE (step 65) and any page in the warmup list that have counts greater than any pages in the cooldown list and that are not marked STAY are set to MIGRATE (step 66). Any remaining unmarked pages are marked as STAY (step 67) so that all pages are marked as STAY or MIGRATE. The net result of steps 64-67 splits and separates pages having ranges of count values that overlap in both lists so that pages in overlapping ranges are not migrated and pages outside of those ranges can be migrated. If the cooldown list was empty in step 62, then all pages in the warmup list are tagged as MIGRATE (step 63) and the mode is set after step 63 or step 67 to MIGRATE.

Figure 6:
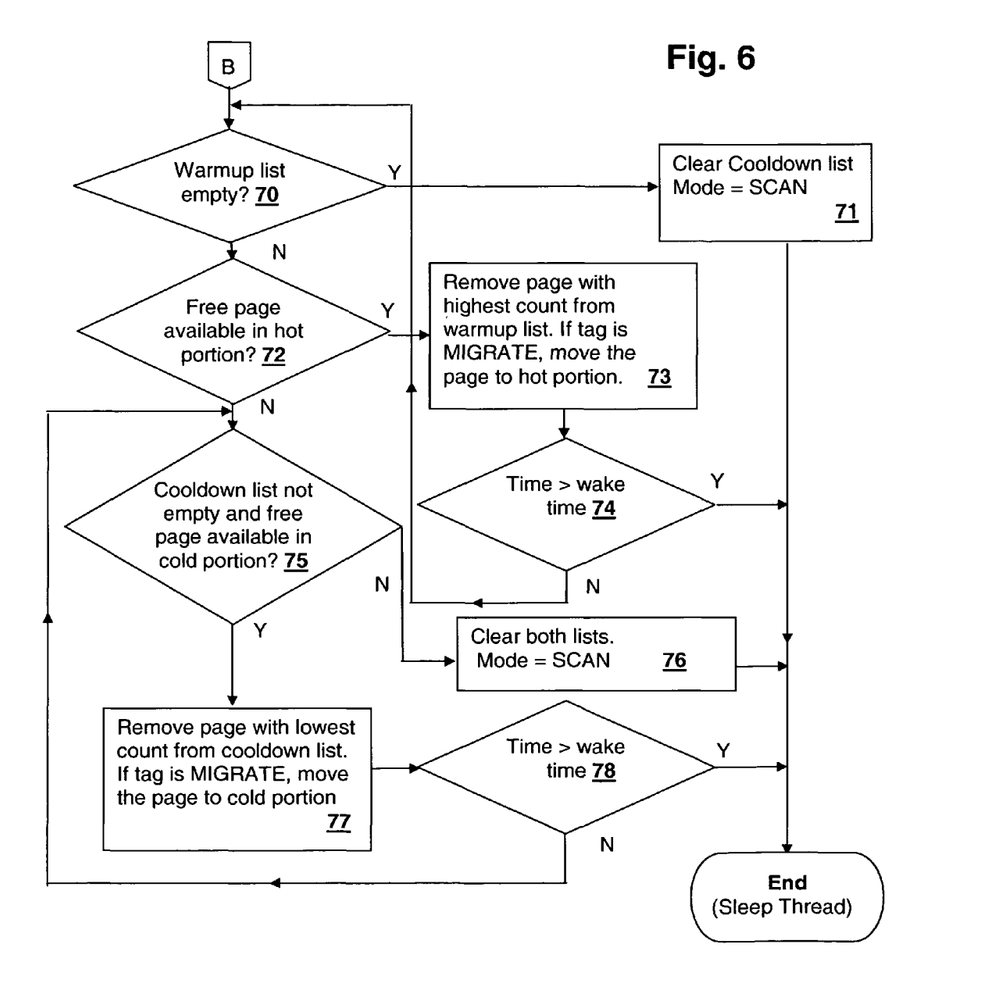

Referring now to FIG. 6, processing of the MIGRATE portion of the method as continued from tag B on FIG. 4. If the warmup list is empty (decision 70), then the cooldown list is cleared and the mode is set back to SCAN (step 71), as no benefit would be obtained from moving pages out of the hot portion of memory at this point. If the warmup list is not empty (decision 70) and there is a free page available in the hot portion (decision 72) then the page with the highest count value in the warmup list is removed from the list. The page is then moved to the hot portion of memory if its corresponding tag value is MIGRATE (step 73). If the wake time has elapsed (decision 74) the thread sleeps, otherwise step 70 is entered again to iterate through the warmup list until it is empty. If no free page is available at any time in step 72, then if the cooldown list is empty or a free page is not available in the cold portion of memory (decision 75) then both lists are cleared and the mode is set back to SCAN (step 76). Otherwise if a free page is available in the cold portion and the cooldown list is not empty, the page with the lowest count from the cooldown list is removed from the list. The page is moved to the cold portion of memory if its corresponding tag value is set to MIGRATE (step 77). If the wake time has elapsed (decision 78) the thread sleeps, otherwise step 75 is entered again to iterate through the cooldown list until it is empty or no free page is available in the cold portion of memory.

The above processes are only one exemplary organization of possible methods that migrate pages between hot and cold memory in conformity with page access count information. The remapping procedure is dependent on the operating system, but will generally use a reverse page lookup to determine what virtual memory pages are assigned to the particular physical page. When the virtual memory (VM) pages are located, the physical page number in each VM table are updated to reflect the new physical page number. The above operation must generally be performed atomically so that no potential memory fault or incorrect mapping is generated. In general, an interrupt is generated when a page is to be migrated and the operating system responds to that interrupt by determining whether or not to permit the migration, performing the migration if permitted and then updating the page tables of any processes sharing the page, including updating the reverse page table that indicates virtual memory pages sharing the physical page. If the page is in the page cache or buffer cache, then the page/buffer cache have to be updated and the previous physical page released (and flushed if the page is modified).

Further, the tables can be inspected prior to migration to determine whether or not a page is shared, is cached or is a buffer-cache page. In general, it is not as desirable to migrate any of the above-types as more overhead is involved than for private un-cached pages. Therefore, the method shown above in FIGS. 4-6 can be further adapted to investigate the VM tables or a reverse lookup table to determine whether the page is private or at least only shared by a few processes in order to determine whether or not the page is a candidate for migration.

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A method of managing a memory array within a processing system, said method comprising:
    counting accesses to each page of data locations of said memory array from a memory controller managing said accesses, wherein said memory array is a common level of system memory comprising multiple memory device ranks;
    determining whether or not pages stored in a first portion of said memory array are accessed less frequently than pages stored in a second portion of said memory array, wherein said first portion and said second portion of said memory array correspond to separate sets of physical dynamic memory devices that are independently power-managed;

responsive to said determining, relocating data stored in less frequently accessed locations of a first portion of said memory array to a second portion of said memory array; further responsive to said determining, relocating data stored in more frequently accessed locations of a second portion of said memory array to a first portion of said memory array; and setting power management states of said first portion of said memory array and said second portion of said memory array in conformity with a frequency of accesses to said corresponding portion of said memory array, wherein said setting selects a first power management state for said first portion of said memory array from among a set of at least two power management states, and wherein said setting selects a second power management state for said second portion of said memory array from among said set of at least two power management states, wherein said at least two power management states are states in which said physical dynamic memory devices are refreshed to retain volatile storage contents, wherein said first portion of said memory array comprises multiple sets of physical dynamic memory devices, and wherein said method further comprises selectively only interleaving storage of consecutive memory chunks across said multiple sets of said physical dynamic memory devices within said first portion of said memory array, whereby an average access time to said first portion of said memory array is reduced, while reducing memory power consumption by not interleaving consecutive memory chunks of said second portion of said memory array.

2. The method of claim 1, wherein said second portion of said memory array comprises multiple sets of physical dynamic memory devices, wherein said method further comprises periodically relocating values stored within said second portion of said memory array to compact said values stored within said second portion of said memory array into a minimum number of said multiple sets of physical dynamic memory devices.

3. The method of claim 1, further comprising:
   first building a cool down list of less frequently accessed pages within a portion of said memory array having a lower-latency power management state;
   second building a warm up list of more frequently accessed pages within a portion of said memory array having a higher-latency power management state, and wherein said relocating is performed subsequent to completion of said first building and said second building and relocates pages in said cool down list to said portion of said memory array having a higher-latency power management state, and further relocates pages in said warm up list to said portion of said memory array having a lower-latency power management.

4. The method of claim 1, wherein said setting is periodically performed by said memory controller further in conformity with a result of said counting.

5. The method of claim 1, further comprising:
   determining an inter-arrival time of requests to each of said first portion and said second portion of said memory array; and
   comparing said determined inter-arrival times for each of said first portion and said second portion of said memory array to a threshold, and wherein said setting is performed in conformity with a result of said comparing.

6. The method of claim 5, wherein said comparing said inter-arrival times further determines a particular power management state in conformity with two or more regions or inter-arrival time values for each of said portions of said memory array.

7. A processing system, comprising:
   a processor for executing program instructions;
   a memory comprising two or more dynamic memory modules implementing a common level of system memory and coupled to said processor for storing said program instructions and data values; and
   a memory controller coupled to said processor, wherein said dynamic memory modules each have multiple power management states controlled in response to a frequency of access to said dynamic memory modules, wherein said multiple power management states are states in which said dynamic memory modules are refreshed to retain volatile storage contents, wherein said memory controller increments an associated counter value for each of multiple pages of physical memory accessed within said memory, and wherein said program instructions comprise program instructions for determining a measure of access frequency to said multiple physical memory pages and migrating said multiple physical memory pages between a first memory module and a second memory module in conformity with said relative access frequency determination, so that particular ones of said multiple physical memory pages having a lower access frequency are migrated to said second memory module and wherein other ones of said multiple physical memory pages having a higher access frequency are migrated to said first memory module, whereby overall power consumption of said memory is reduced, wherein said first memory module comprises multiple memory device ranks and wherein said program instructions further comprise program instructions for selectively only interleaving storage of consecutive memory chunks within said first memory module, whereby an average access time to said first memory module is reduced, while reducing memory power consumption by not interleaving consecutive memory chunks of said second memory module.

8. The processing system of claim 7, wherein said second memory module comprises multiple memory device ranks and wherein said program instructions further comprise program instructions for periodically relocating values stored within said second portion of said memory array to compact said values stored within said second portion of said memory array into a minimum number of said multiple sets of physical memory devices.

9. The processing system of claim 7, wherein said program instructions further comprise program instructions for:
   first building a cool down list of less frequently accessed pages within a first one of said two or more dynamic memory modules having a lower-latency power management state;
   second building a warm up list of more frequently accessed pages within a second one of said two or more dynamic memory modules having a higher-latency power management state, and wherein said program instructions for migrating are executed subsequent to completion of said first building and said second building and migrate pages in said cool down list to said second one of said two or more dynamic memory modules, and further migrate pages in said warm up list to said first one of said two or more dynamic memory modules.

10. The processing system of claim 7, wherein said program instructions determine whether or not a particular page is one of a cached page a shared page or a buffer cache page, and wherein said program instructions for migrating are executed selectively in conformity with determining that said particular page is not one of a cached page a shared page or a buffer-cache page.

11. The processing system of claim 7, wherein said memory controller includes a command unit for sending commands to said at least two dynamic memory modules, a usage evaluator having an input coupled to an output of said command unit for evaluating a frequency of use of each of said at least two dynamic memory modules, and control logic coupled to said usage evaluator and further coupled to an input of said command unit for sending power management commands to said at least two dynamic memory modules in response to said usage evaluator detecting that a usage level of one of said dynamic memory modules has fallen below a threshold level, whereby said device controller power manages said at least two dynamic memory modules without intervention by said processor.

12. The processing system of claim 11, wherein said usage evaluator determines inter-arrival times of requests to each of said at least two dynamic memory modules.

13. The processing system of claim 12, wherein said at least two dynamic memory modules each have at least three power management states, and wherein said memory controller further determines a particular power management state for each of said at least two dynamic memory modules in conformity with multiple regions of inter-arrival time values.

14. The processing system of claim 7, wherein said memory controller increments and stores said counter values for each of said multiple physical memory pages within locations of a particular one of said dynamic memory modules having a lower latency power management state than other ones of said dynamic memory modules, whereby said program instructions can access said counter values directly from said memory.

* * * * *